(12) United States Patent
Al-Otaibi et al.

(10) Patent No.: US 11,815,444 B2
(45) Date of Patent: Nov. 14, 2023

(54) THERMOELECTRIC POLYMER SYSTEM FOR CORROSION MONITORING

(71) Applicant: Saudi Arabian Oil Company, Dhahran (SA)

(72) Inventors: Salem A. Al-Otaibi, Dammam (SA); Alaa M. Benmahfoudh, Dammam (SA); Meshary A. Al-Bahli, Al Khobar (SA); Abdulaziz A. Al-Juaid, Dammam (SA)

(73) Assignee: Saudi Arabian Oil Company, Dhahran (SA)

( * ) Notice: Subject to any disclaimer, the term of this patent is extended or adjusted under 35 U.S.C. 154(b) by 107 days.

(21) Appl. No.: 17/501,661

(22) Filed: Oct. 14, 2021

(65) Prior Publication Data

US 2023/0119818 A1  Apr. 20, 2023

(51) Int. Cl.
*G01N 17/02* (2006.01)
*H10N 10/17* (2023.01)

(52) U.S. Cl.
CPC .......... *G01N 17/02* (2013.01); *H10N 10/17* (2023.02)

(58) Field of Classification Search
CPC ........ G01N 17/02; G01N 25/32; H10N 10/00; H10N 15/00
USPC ....................................... 324/71.2, 106, 451
See application file for complete search history.

(56) References Cited

U.S. PATENT DOCUMENTS

| | | | | |
|---|---|---|---|---|
| 4,019,133 A | * | 4/1977 | Manley | G01N 27/041 324/71.2 |
| 4,995,732 A | * | 2/1991 | Lingorski | G01K 13/00 374/139 |
| 5,507,879 A | * | 4/1996 | Gyoten | H10N 10/852 136/238 |
| 6,946,855 B1 | * | 9/2005 | Hemblade | G01N 17/04 324/71.2 |

(Continued)

FOREIGN PATENT DOCUMENTS

| | | | | |
|---|---|---|---|---|
| AU | 2006320798 A1 | * | 6/2008 | ............. G01N 17/04 |
| CN | 1975310 A | * | 6/2007 | |

(Continued)

OTHER PUBLICATIONS

Guan et al., Thermoelectric polymer films with a significantly high Seebeck coefficient and thermoelectric power factor obtained through surface energy filtering. J. Mater. Chem. A, 2020, 8, 13600-13609. The Royal Society of Chemistry 2020 (Year: 2020).*

(Continued)

*Primary Examiner* — Patrick Assouad
*Assistant Examiner* — Sean Curtis
(74) *Attorney, Agent, or Firm* — Fish & Richardson P.C.

(57) ABSTRACT

A method and a system for monitoring a mechanical device for internal corrosion are provided. An exemplary method includes placing a sampling thermoelectric polymer sheet (TEPS) on an external surface of the mechanical device to be monitored for internal corrosion, and placing a reference TEPS on an external surface of the mechanical device not susceptible to internal corrosion. A current from the sampling TEPS is measured, and a current from the reference TEPS is measured. Potential internal corrosion is identified from changes between the current from the sampling TEPS and the current from the reference TEPS.

14 Claims, 7 Drawing Sheets

(56) References Cited

U.S. PATENT DOCUMENTS

| | | | |
|---|---|---|---|
| 10,760,742 B2 * | 9/2020 | Rud | G01K 1/16 |
| 11,223,003 B2 * | 1/2022 | Hayashi | H10N 10/855 |
| 11,555,777 B2 * | 1/2023 | Alanazi | G01N 17/043 |
| 2007/0223556 A1 * | 9/2007 | Lee | G01K 15/00 |
| | | | 374/161 |
| 2011/0238347 A1 * | 9/2011 | Gemperli | C23F 13/22 |
| | | | 702/65 |
| 2016/0197211 A1 * | 7/2016 | Hsiao | H01L 31/0547 |
| | | | 438/54 |
| 2019/0293241 A1 * | 9/2019 | Rud | G01K 1/143 |
| 2020/0111942 A1 * | 4/2020 | Therrien | C23C 28/021 |
| 2020/0212281 A1 * | 7/2020 | Hayashi | H10N 10/10 |
| 2021/0018425 A1 * | 1/2021 | Alanazi | G01N 17/043 |
| 2021/0135080 A1 * | 5/2021 | Karthikeyan | H10N 10/17 |
| 2023/0119818 A1 * | 4/2023 | Al-Otaibi | H10N 10/17 |
| | | | 324/71.2 |

FOREIGN PATENT DOCUMENTS

| | | | |
|---|---|---|---|
| CN | 201218804 Y * | 4/2009 | |
| CN | 101515002 B * | 1/2011 | |
| CZ | 298451 B6 * | 10/2007 | |
| DE | 3147607 | 6/1983 | |
| DE | 3147607 A * | 6/1983 | G01B 7/06 |
| JP | 02093315 A * | 4/1990 | |
| JP | H0293315 | 4/1990 | |
| JP | H0590105 U * | 12/1993 | |
| JP | 2004347268 A * | 12/2004 | |
| JP | 2019024044 A * | 2/2019 | |
| JP | 2020196929 A * | 12/2020 | |
| KR | 20130028377 A * | 3/2013 | |
| WO | WO-9700428 A1 * | 1/1997 | G02B 6/032 |
| WO | WO-2016089707 A1 * | 6/2016 | H01L 35/08 |
| WO | WO-2019064949 A1 * | 4/2019 | H01L 35/10 |
| WO | WO-2021011616 A1 * | 1/2021 | G01N 17/006 |

OTHER PUBLICATIONS

Matheson, Rob., Thermoelectric devices turn waste heat into electricity for vehicles andother machines. https://phys.org/news/2014-08-thermoelectric-devices-electricity-vehicles-machines.html. Aug. 2014 (Year: 2014).*

English Translation of DE 3147607 A1. (Year: 2022).*

Petsagkourakis et al., Thermoelectric materials and applications for energy harvesting power generation. Science and Technology of Advanced Materials 2018, vol. 19, No. 1, 836-862; https://doi.org/10.1080/14686996.2018.1530938 (Year: 2018).*

Chu, Jennifer., Turning heat into electricity. MIT News | Massachusetts Institute of Technology. https://news.mit.edu/2018/topological-materials-turning-heat-electricity-0117. Jan. 2018 (Year: 2018).*

PCT International Search Report and Written Opinion in International Appln. No. PCT/US2022/077846, dated Feb. 6, 2023, 12 pages.

Cadelano et al., "Corrosion Detection in Pipelines Using Infrared Thermography: Experiments and Data Processing Methods," Journal of Nondestructive Evaluation, Plenum Publishing Corporation, New York, US, 35(3): 1-11, Aug. 2016, 11 pages.

Laaidi et al., "Pipeline Corrosion, Modeling and Analysis," Journal of Nondestructive Evaluation, Kluwer Academic Publishers-Plenum Publishers, NE, 30(3): 158-163, Jun. 2011, 6 pages.

Ruan et al., "A Self-Powered Flexible Thermoelectric Sensor and It's Application on the Basis of the Hollow PEDOT:PSS Fiber," Polymers, 12(3): 553, Mar. 2020, 16 pages.

Ortiz et al., "Evaluation of the intergranular corrosion susceptibility of UNS S31803 duplex stainless steel with thermoelectric power measurements," Corrosion Science, Apr. 2013, 69:236-244.

Ren et al., "A method of pipeline corrosion detection based on hoop-strain monitoring technology," Struct. Control Health Monit., Aug. 2016, 24:e1931.

Taroni et al., "Toward Stretchable Self-Powered Sensors Based on the Thermoelectric Response of PEDOT:PSS/Polyurethane Blends," Advanced Functional Materials, Dec. 2017, 28(15):1704285.

* cited by examiner

THERMOELECTRIC POLYMER SYSTEM FOR CORROSION MONITORING

TECHNICAL FIELD

The present disclosure is directed to detecting internal corrosion in pipes and equipment. Specifically, thermoelectric polymer films are used to monitor the temperature of the external surface to determine if internal corrosion is occurring.

BACKGROUND

The identification and location of corrosion on internal surfaces of pipelines and chemical equipment is important to prevent pipe or equipment failure. Equipment failure can lead to release of chemicals, causing shutdowns and other process issues. A number of techniques have been tested and implemented to monitor equipment for corrosion. These techniques include radiofrequency identification sensors placed or mounted to equipment, for example, in refineries, which emit radio waves into the equipment and detect corrosion by changes in signals. Another technique uses magnetism of the equipment to monitor inductive changes in the pipe. As corrosion changes the inductance of the equipment, it can be identified. However, current techniques are complex, expensive, or both.

SUMMARY

An embodiment described herein provides a method for monitoring a mechanical device for internal corrosion. The method includes placing a sampling thermoelectric polymer sheet (TEPS) on an external surface of the mechanical device to be monitored for internal corrosion, and placing a reference TEPS on an external surface of the mechanical device not susceptible to internal corrosion. A current from the sampling TEPS is measured, and a current from the reference TEPS is measured. Potential internal corrosion is identified from changes between the current from the sampling TEPS and the current from the reference TEPS.

Another embodiment described herein, provides a system for monitoring a mechanical device for internal corrosion. The system includes a sampling thermoelectric polymer sheet (TEPS) disposed on an external surface of the mechanical device in a location that is susceptible to internal corrosion. A reference TEPS is disposed on an external surface of the mechanical device in a location that is not susceptible to internal corrosion. The system includes an ammeter to measure a current generated by the sampling TEPS and an ammeter to measure a current generated by the reference TEPS. The system includes a difference calculator to determine a difference between the current generated by the sampling TEPS and the current generated by the reference TEPS.

DETAILED DESCRIPTION

Smart materials that directly respond to environment conditions are being rapidly developed. One smart material is a thermoelectric (TE) polymer such as TE material based on conjugated polymers including p-type and n-type. TE polymers can include poly(3-4-ethylenedixoythiophene) (PEDOT), polycarbazole, polythiophenes, polyanilines, and polyactylene, among others. A TE polymer converts heat into electricity that can be measured. Research in this field has resulted in the development of organic TE polymers that are easy to fabricate with relatively low material cost. In addition, simple molecular modifications, such as using comonomers and blends, such as PEDOT/PSS (polystyrene sulfonate), allows the chemical and physical properties of the polymers. As a result, the TE polymers can be utilized for various engineering applications.

Embodiments described herein use thermoelectric (TE) polymer sheets (TEPS) to monitor and assess the internal corrosion of mechanical equipment. As used herein, mechanical equipment or equipment, includes pipes, vessels, pumps, or other plant units that are vulnerable to internal corrosion.

As used herein, a polymer sheet is about 100 µm to about 1000 µm. Thinner sheets will have more flexibility, but generate less current in response to heat. However, thinner sheets may respond more quickly to temperature changes than thicker sheets. In contrast to systems that detect metal loss at specific locations or spots, such as using magnetic or ultrasonic sensors, the techniques described herein have the potential to sense and monitor the corrosion over larger portions of the examined surfaces without the need for moving a sensor.

In some embodiments, the system includes at least two TEPS that are placed on the external wall of the mechanical equipment under consideration, a sampling TE polymer sheet in a location prone to corrosion, and a reference TE polymer sheet placed in a location that is less prone to corrosion. As discussed with respect to FIG. 1, Transient heat transfers from the process fluid inside the equipment to the TEPS through the wall via conduction heat transfer. The TE polymers convert the absorbed heat into electrical current, based on a temperature differential across the TE polymer, which can be sensed and measured.

The transferred heat is a function of the adjacent medium, such as the thickness of the external wall of the mechanical equipment being monitored. In principle, thicker walls allow less amount of heat to be transferred compared to thinner ones. Since the surfaces of the equipment that are in close proximity undergo the same temperature variations from the process fluid, the most important variable for current variation is the difference in the loss of wall thickness in one location compared to the other location, which is an indication of localized internal corrosion. This characteristic feature may be considered as a one-to-one relationship between the internal corrosion and the generated current. Accordingly, the difference in current between the sampling film and the reference film may indicate and locate internal corrosion.

Figure 1:
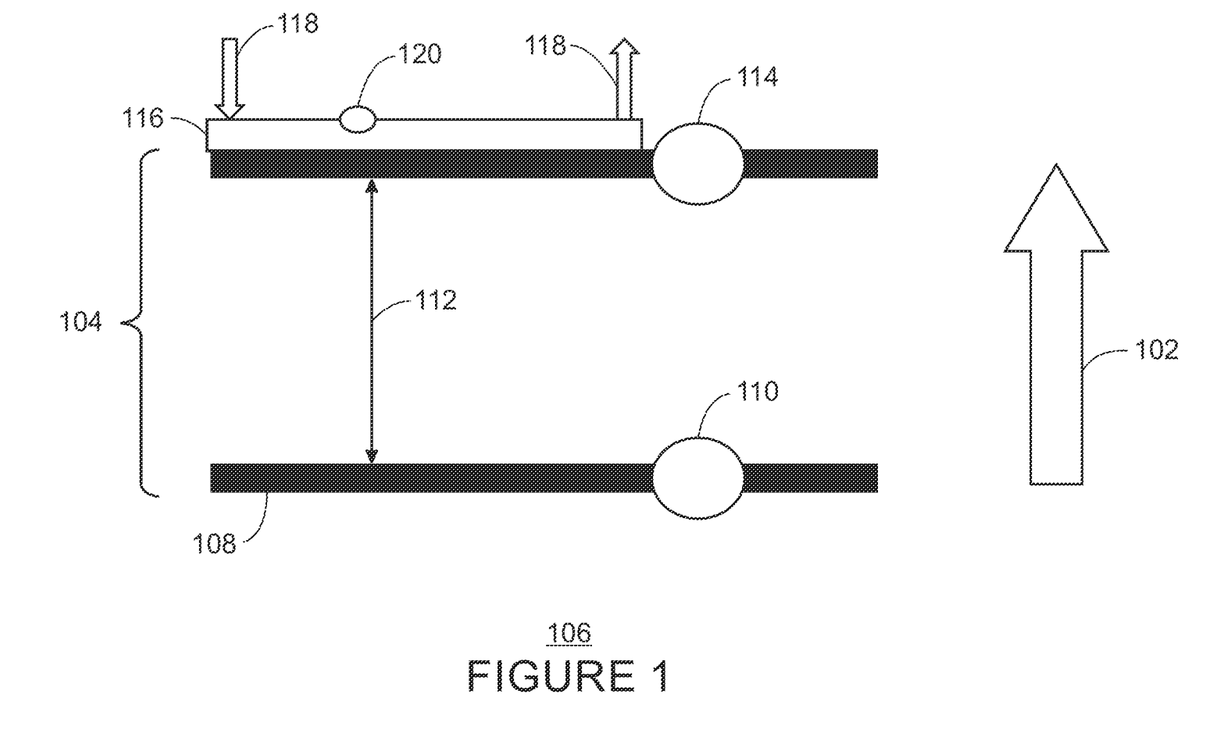
FIG. 1 is a schematic diagram of inductive heat transfer across the wall of the pipe.

FIG. 1 is a schematic diagram of an inductive heat transfer 102 across a wall 104 of the pipe. The process fluid 106 inside the equipment has a temperature that is based on the process operation. The process fluid 106 heats the wall 104 by conductive heat transfer or conduction, bringing the temperature of the inner surface 108 of the wall 104 to a first temperature ($t_1$) 110. Conductive heat transfer takes place when there is a temperature gradient in a medium. With conduction, energy transfers from more energetic regions (hotter) to less energetic molecules (cooler) when neighboring molecules collide. Heat flows in direction of decreasing temperatures since higher temperatures are associated with higher molecular energy.

The amount of heat transferred depends on the thermal conductivity of the material of the wall 104 of the pipe, and the thickness 112 of the wall 104. The formula in Equation 1 provides a model of the inductive heat transfer 102 through the wall 104 of the pipe which raises the external surface of the wall 104 of the pipe to a second temperature ($t_2$) 114.

$$q = \frac{kA\Delta T_m}{t} \quad (1)$$

In Equation 1, q is the heat transfer (W, J/s, Btu/hr), k is the thermal conductivity of the material (W/m·K, W/m·° C., or Btu/(hr·° F.·ft)), t is the material thickness (m or ft), and A is the heat transfer area ($m^2$ or $ft^2$). $\Delta T_m$ is $t_1 - t_2$, which is the temperature gradient over the wall 104, with $t_1$ 110 being the temperature of fluid and $t_2$ 114 the temperature of the surface (° C. or ° F.).

TE polymers can be classified using a figure of merit, ZT, which is a dimensionless figure that indicates the performance of the thermoelectric material. ZT depends on a number of parameters from the material properties of the TE polymers, as shown in Equation 2.

$$ZT = \frac{\sigma S^2 T}{k} \quad (2)$$

In Equation 2, ZT is the figure of merit, σ is the electrical conductivity of the TE polymer, S is the Seebeck coefficient, which is the ratio of induced voltage over the temperature difference across the TE material. Also in Equation 2, T is the temperature and k is the thermal conductivity.

For the use of TE materials in power generation, the value of ZT value is important. However, in various embodiments described herein, a TEPS 116 is used to create a detectable current, rather than to generate power. The current, I, generated by the TEPS 116, as determined between electrical connections 118 at each end of the TEPS 116, is shown in Equation 3.

$$I = \frac{S\Delta T_{TEP}}{(R_{in} + R)} \quad (3)$$

In Equation 3, I is the electric current generated by the TEPS 116, S is the Seebeck coefficient, $\Delta T_{TEP}$ is the temperature difference across the TEPS 116, $t_2$ 114–$t_3$ 120. The surface temperature, $t_2$ 114, of the wall 104 is the hot side of the TEPS 116 and the external surface temperature, $t_3$ 120, of the TEPS 116, is the cold side. The term $R_{in}$ is the internal resistance of the material and R is the additional resistance in the closed circuit, e.g., due to the system used to measure the current.

Since both $\Delta T_m$ from Equation 1 and $\Delta T_{TEP}$ from Equation 3 share the parameter $t_2$ 114, variation of the material thickness, t, in Equation 1 will alter the value of the current in Equation 3. Hence, loss of thickness can be detected by changes in the current.

The proposed system is composed of several isolated or interconnected TE polymer sheets that are placed on an external surface of the wall 104 of the mechanical equipment under consideration. Transient heat transfers from the process fluid 106 inside the equipment to the TE polymer sheets through the wall via conduction heat transfer. Consequently, the TE polymer sheets convert the absorbed heat into electrical current, which can be sensed and measured.

As described herein, the transferred heat is a function of the adjacent medium, or wall thickness. Since surfaces in close proximity should reach the same temperature from the process fluid, the only variable for current variation is a higher loss of wall thickness in one location over the other location. This indicates localized internal corrosion. For more optimization, TE polymer sheets could be placed at different sections of the external wall that are more susceptible to internal corrosion such as chemical injection points, as described with respect to FIG. 2.

Figure 2:
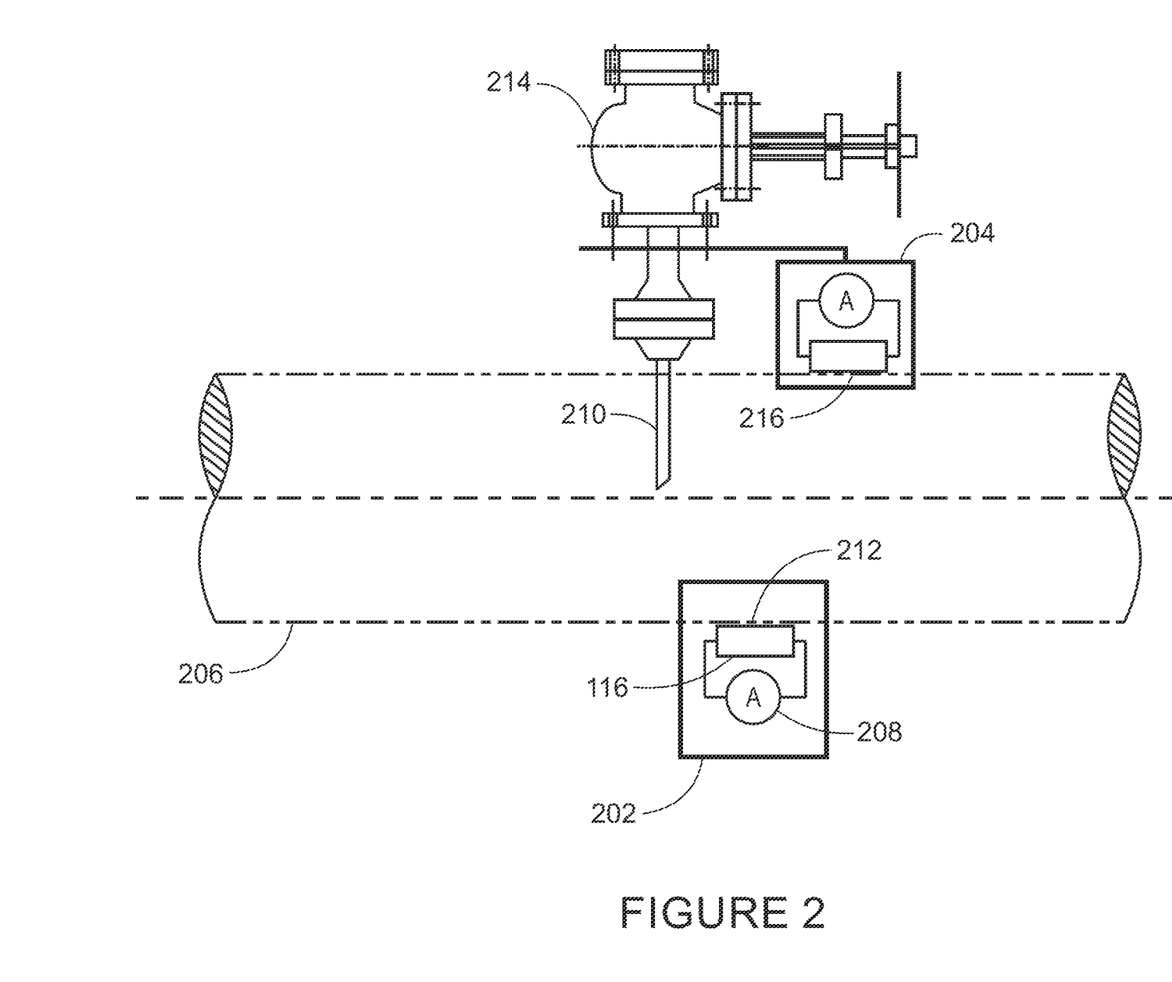
FIG. 2 is a drawing of the placement of thermoelectric polymer sensors on piping.

FIG. 2 is a drawing of the placement of thermoelectric polymer sensors (TPS) 202 and 204 on a pipe 206. Like numbered items are as described with respect to FIG. 1. Each TPS 202 includes a TEPS 116 and an ammeter 208 electrically coupled to the TEPS 116. The ammeter 208 may be part of a controller, as discussed further with respect to FIG. 9.

The mechanical flexibility of the TE polymers allow for a variety of shapes for the TEPS 116, allowing the selection of a shape to cover locations while conserving the TE polymers. Further, the shapes may be selected to maintain a high probability of detection (PoD) and precision to locate the internal corrosion.

In the example of FIG. 2, a sampling TPS 202 is placed on the wall of the pipe 206 opposite an injection quill 210, where the internal surface 212 is expected to show localized corrosion or erosion. A reference TPS 204 is placed along the pipe 206 near an isolation valve 214 controlling the flow to the injection quill 210, where the internal surface 216 is not expected to show corrosion.

Possible shapes that may be selected for the detection of corrosion are described with respect to FIGS. 3-7. In each of these Figures the view is from below the pipe 206, or the 6 o'clock position, looking up at the pipe 206 at the position most susceptible to corrosion, e.g., at the outer surface of the pipe 206 over the internal surface 212. Further, although not shown, in some embodiments, the reference TPS 204 is used in each of these embodiments, using a TEPS 116 matching the same shape. In other embodiments, comparisons of the current between different sampling TP sensors is used for determining corrosion.

Figure 3:
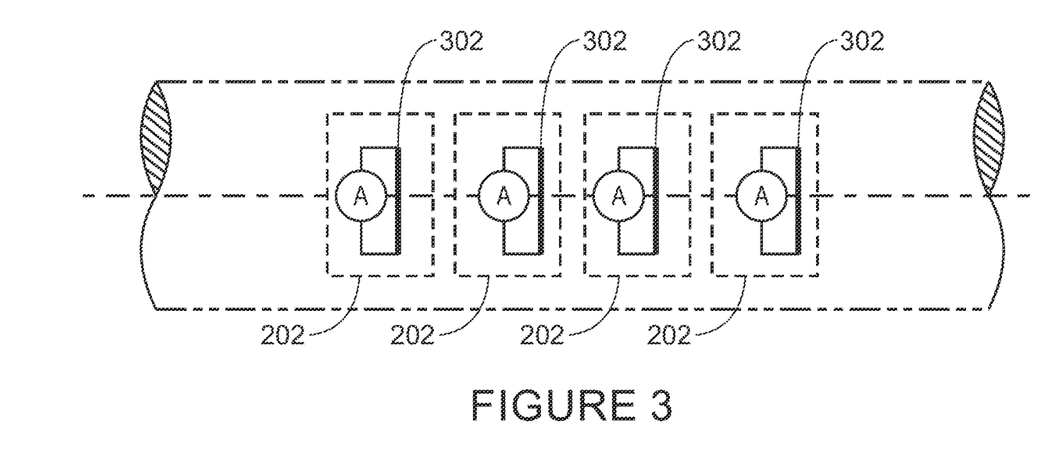
FIG. 3 is a drawing of thermoelectric polymer sensors based on a strip of the TEPS.

FIG. 3 is a drawing of thermoelectric polymer sensors 202 based on a strip 302 of the TEPS 116. Like numbered items are as described with respect to FIG. 2. In some embodiments, the inspection using this configuration compares the current generated among the strips 302. The strip 302 with the largest difference compared to the others will indicate a localized corrosion underneath it. The precision to pinpoint the corrosion location is high using the strips 302. However, the probability of detection may be limited compared to other configurations due to limited area covered.

Figure 4:
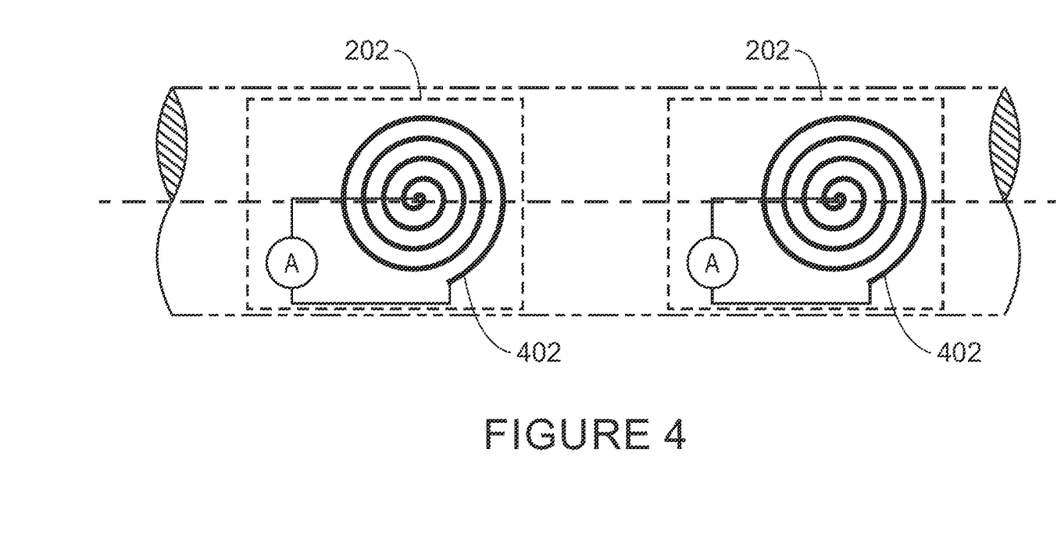
FIG. 4 is a drawing of thermoelectric polymer sensors based on a spiral of the TEPS.

FIG. 4 is a drawing of thermoelectric polymer sensors 202 based on a spiral 402 of the TEPS 116. Like numbered items are as described with respect to FIG. 2. In some embodiments, the inspection using this configuration compares the current generated by each of the spirals 402. The variation in the current will indicate a localized area of corrosion underneath the area covered by the spiral. The precision to pinpoint the corrosion location for the spiral 402 gets lower as the radius of the spiral 402 is increased. However, the probability of detection becomes higher with increasing radius.

Figure 5:
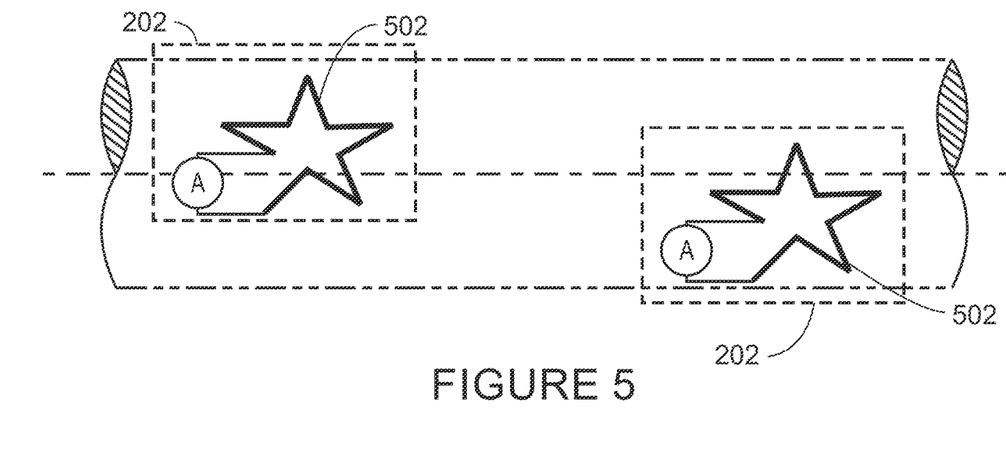
FIG. 5 is a drawing of thermoelectric polymer sensors based on a star of the TEPS.

FIG. 5 is a drawing of thermoelectric polymer sensors 202 based on a star 502 of the TEPS 116. Like numbered items are as described with respect to FIG. 2. In some embodiments, the inspection using this configuration compares the current generated by each of the stars 502. A large current difference will indicate a localized corrosion underneath the area covered by the star shape. The precision to pinpoint the corrosion location in this shape is medium while the probability of detection is high covering relatively large areas at different directions.

Figure 6:
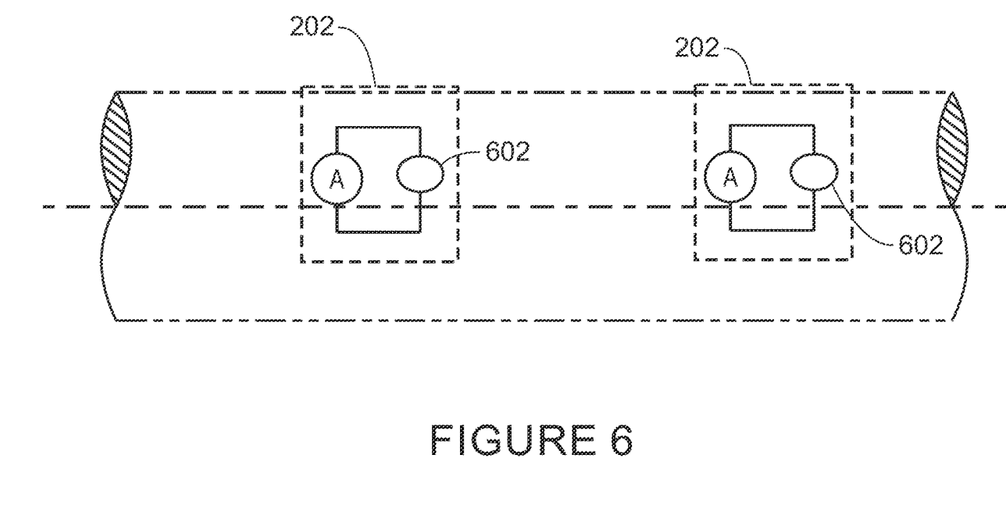
FIG. 6 is a drawing of thermoelectric polymer sensors based on a star of the TEPS.

FIG. 6 is a drawing of thermoelectric polymer sensors 202 based on a dot 602 of the TEPS 116. Like numbered items are as described with respect to FIG. 2. In some embodiments, the inspection using this configuration compares the current generated by each of the dots 602. A large current difference will indicate a localized corrosion underneath the area covered by the dot 602. The precision to pinpoint the corrosion location in this shape is very high as the area covered by the dot 602 is low. However, for the same reasons, the probability of detection is low.

Figure 7:
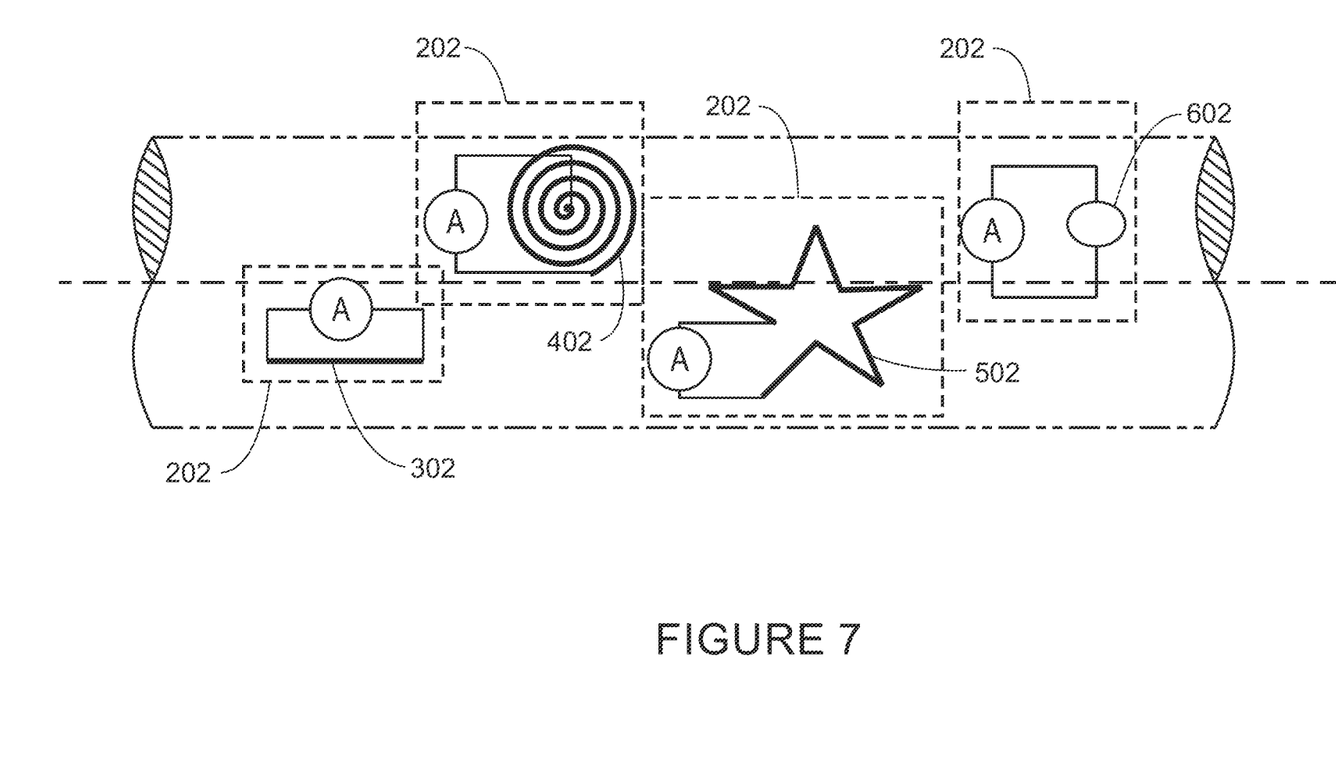
FIG. 7 is a drawing of thermoelectric polymer sensors that include a combination of the different shapes discussed above.

FIG. 7 is a drawing of thermoelectric polymer sensors 202 that include a combination of the different shapes discussed above. Like numbered items are as described with respect to the previous figures. The different shapes can be combined depending on the equipment configuration in the field. This may be used to increase both the probability of detection and the localization of the corrosion for specific equipment. However, if the comparison is between the different shapes, the differences in the areas of the polymers is used to make corrections when comparing currents from different shapes.

As described herein, in some embodiments a reference shape may be placed to provide a baseline comparison of current. In applications that use multiple different shapes, the current from the reference shape may be corrected for the different shapes, or multiple reference shapes may be placed on the equipment.

Each of the above shapes has its use depending on the required precision, probability of detection and available surface on the equipment. This is summarized in Table 1.

TABLE 1 summary of placement shapes.

| Placement shape | Probability of Detection (PoD) | Precision to pinpoint the corrosion location |
| --- | --- | --- |
| Strips | Low | High |
| Spiral | High | High (Gets lower with increasing spiral radius) |
| Star | High | Medium |
| Spot | Very Low | Very High |

The techniques described herein may be applied to detect metal loss in the header piping near injection points and nozzle, detect metal loss due to corrosion under insulation (CUI), detect metal loss on non-scrapeable pipelines, or in on-stream inspection programs, among many other applications.

TE polymers are very suitable for use as a TPS 202, provided that the surface temperature does not exceed the thermal operating window for the different TE polymers. For example, PEDOT:PSS has the window between room temperature and 160° C. For many applications, this covers the normal operating temperatures.

Utilizing the TE polymers to monitor the thickness of metal surfaces is applicable when there is a temperature variation, and is most effective when process fluid temperature is higher than the ambient temperature. Therefore, it may not be as effective in cold services.

The TPS 202 depends on heat transfer to convert heat to electricity. Thus, the TPS 202 must be placed directly on an external wall of the equipment external wall. Further, pipe coatings may affect the accuracy of the TE polymers, for example, if they have different dry film thickness (DFT) between two locations on the same equipment.

Figure 8:
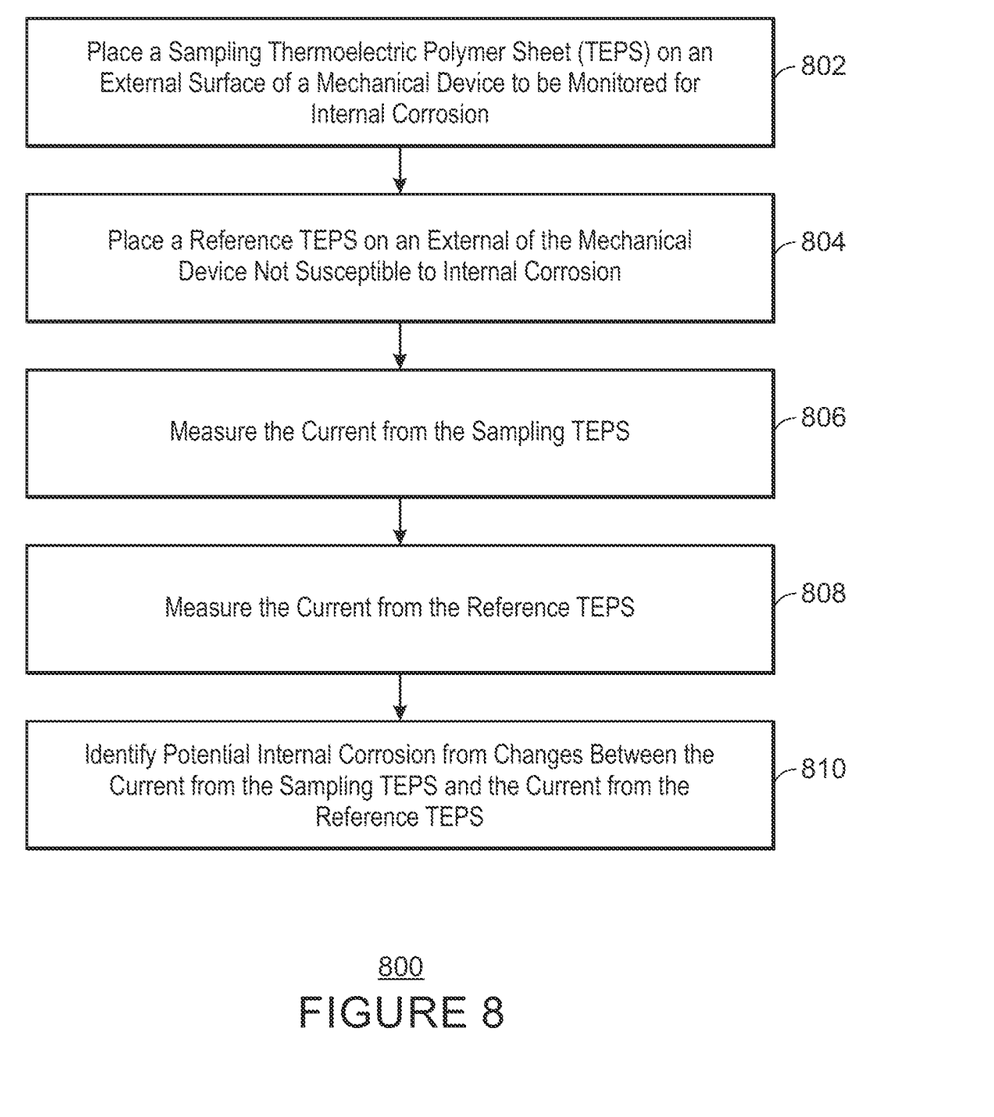
FIG. 8 is a process flow diagram of a method for determining corrosion in a pipe using thermoelectric polymer sensors.

FIG. 8 is a process flow diagram of a method 800 for determining corrosion in a pipe using thermoelectric polymer sensors. At block 802, a sampling thermoelectric polymer sheet (TEPS) is placed on an external surface of the mechanical device to be monitored for internal corrosion. Generally, the TEPS is placed over a region known to be susceptible to internal corrosion. This determination may be made by past failures, internal inspections, theoretical considerations, and the like.

At block 804, a reference TEPS is placed on an external surface of the mechanical device at a location not susceptible to internal corrosion. The determination of the location for the reference TEPS may be made by determining undamaged areas in previous corrosion repairs, internal inspections, theoretical considerations, and the like.

At block 806, the current from the sampling TEPS is measured. At block 808, the current from the reference TEPS is measured. At block 810, potential internal corrosion is identified by changes between the current from the sampling TEPS and the current from the reference TEPS. The current differential may be measured at specified intervals, such as once every 12 hours, once every 24 hours, once every 48 hours, or longer.

If a significant difference, for example, about 5%, about 10%, about 20%, or more, in current between the sampling TEPS and the reference TEPS develops, a follow up inspection using a quantitative method, such as x-ray analysis, ultrasonic imaging, and the like, can be utilized to confirm the problem and indicate the required engineering recommendation.

Figure 9:
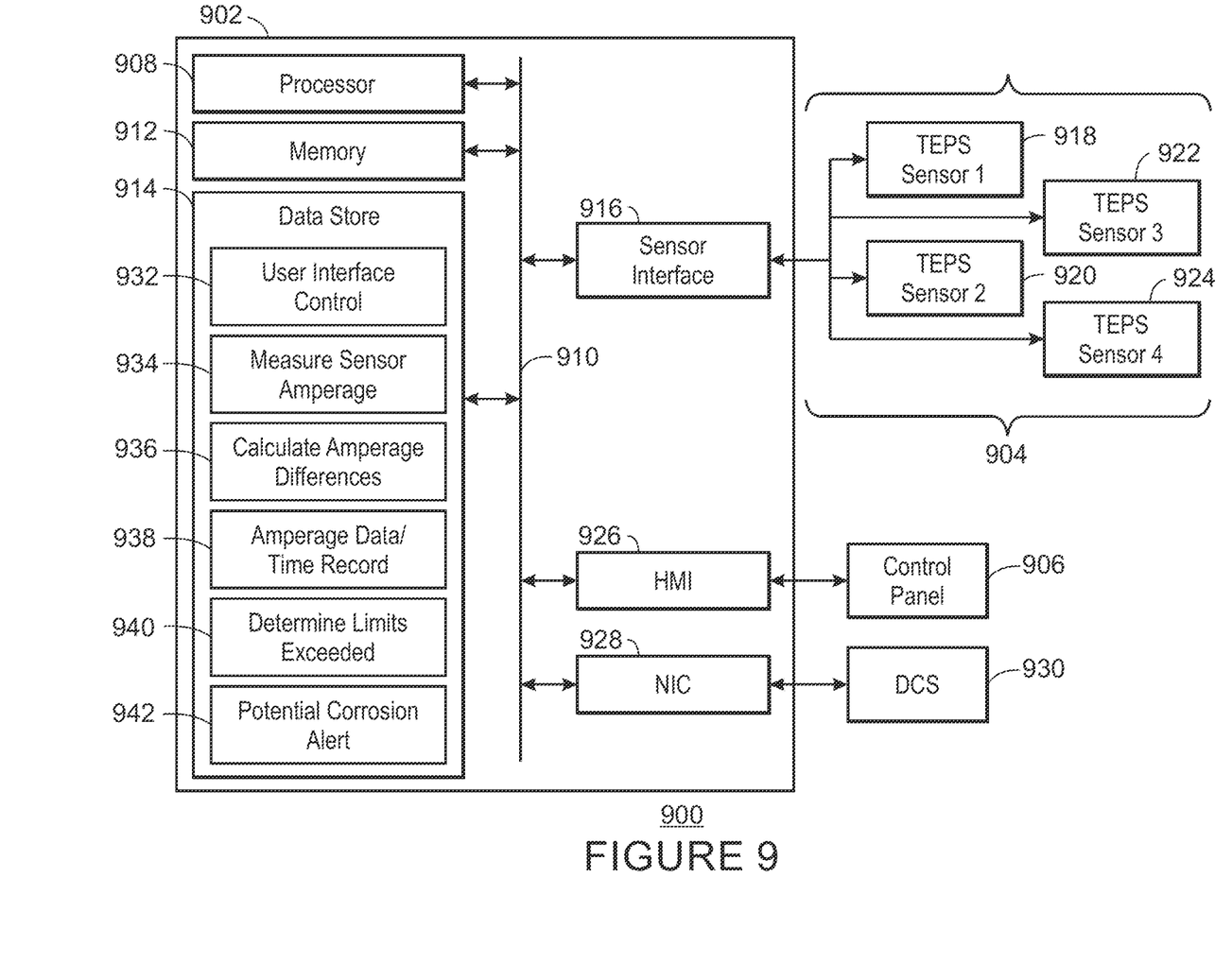
FIG. 9 is a block diagram of a system for monitoring thermoelectric polymer sensors.

FIG. 9 is a block diagram of a system 900 for monitoring thermoelectric polymer sensors. The system 900 includes a controller 902, TE polymer sheet (TEPS) sensors 904, and a control panel 906. In some embodiments, controller 902 is a microcontroller, for example, mounted in the enclosure with the control panel 906 near the TEPS sensors 904. In other embodiments, the controller 902 is a virtual controller running on a processor in a DCS, on a virtual processor in a cloud server, or using other real or virtual processors.

The controller 902 includes a processor 908. The processor 908 may be a microprocessor, a multi-core processor, a multithreaded processor, an ultra-low-voltage processor, an embedded processor, or a virtual processor. In some embodiments, the processor 908 may be part of a system-on-a-chip (SoC) in which the processor 908 and the other components of the controller 902 are formed into a single integrated electronics package. In various embodiments, the processor 908 may include processors from Intel® Corporation of Santa Clara, California, from Advanced Micro Devices, Inc. (AMD) of Sunnyvale, California, or from ARM Holdings, LTD., Of Cambridge, England. Any number of other processors from other suppliers may also be used.

The processor 908 may communicate with other components of the controller 902 over a bus 910. The bus 910 may include any number of technologies, such as industry standard architecture (ISA), extended ISA (EISA), peripheral component interconnect (PCI), peripheral component interconnect extended (PCIx), PCI express (PCIe), or any number of other technologies. The bus 910 may be a proprietary bus, for example, used in an SoC based system. Other bus technologies may be used, in addition to, or instead of, the technologies above.

The bus 910 may couple the processor 908 to a memory 912. In some embodiments, such as in programmable logic controllers (PLCs) and other process control units, the memory 912 is integrated with a data store 914 used for long-term storage of programs and data. The memory 912 include any number of volatile and nonvolatile memory devices, such as volatile random-access memory (RAM), static random-access memory (SRAM), flash memory, and the like. In smaller devices, such as PLCs, the memory 912 may include registers associated with the processor itself. The data store 914 is used for the persistent storage of information, such as data, applications, operating systems, and so forth. The data store 914 may be a nonvolatile RAM, a solid-state disk drive, or a flash drive, among others. In some embodiments, the data store 914 will include a hard disk drive, such as a micro hard disk drive, a regular hard disk drive, or an array of hard disk drives, for example, associated with a DCS or a cloud server.

The bus 910 couples the processor 908 to a sensor interface 916. The sensor interface 916 connects the controller 902 to each of the TEPS sensors 904. In some embodiments, the sensor interface 916 is a bank of analog-to-digital converters (ADCs) configured to measure the amperage generated by the TEPS sensors 904, for example, by measuring a voltage across a resistor placed in parallel to each of the TEPS sensors 904. As the amperage will be low, such as microamps, in some embodiments, the resistor is about 1 megaohm (MΩ), 5 MΩ, or higher.

The individual TEPS sensors 918, 920, 922, and 924, may include any combinations of the sensor shapes described with respect to the previous figures. In some embodiments, a group of the TEPS sensors 904, such as TEPS sensor 1 918 and TEPS sensor 2 920, are placed in sampling locations, e.g., where equipment is susceptible to internal corrosion. In some embodiments, a group of the TEPS sensors 904, such as TEPS sensor 3 922 and TEPS sensor 4 924, are placed in reference locations, e.g., where equipment is not susceptible to internal corrosion. As described herein, the comparison of the amperage generated from these two sets of sensors can be used to determine potential corrosion on internal surfaces of equipment.

The bus 910 couples the processor 908 to a human machine interface (HMI) 926. The HMI 926 couples the controller 902 to a control panel 906. As discussed herein, in some embodiments, the controller 902 may be colocated with the control panel 906 in a single enclosure proximate to the TEPS sensors 904. In some embodiments, the controller 902 may be part of a distributed control system or control system that controls a plant a refinery. The control panel 906 includes a data entry tool, such as a keypad or programmable touchscreen, and a data display, such as a touchscreen, an LCD, LED, or numerical display.

The bus 910 couples the processor 908 to a network interface controller (NIC) 928. The NIC 928 couples the controller 902 to external units, such as a distributed control system (DCS) 930, among others. In some embodiments, the HMI 926 and the control panel 906 are omitted and all control and display is routed through the DCS 930.

The data store 914 includes blocks of stored instructions that, when executed, direct the processor 908 to implement the functions of the controller 902. The data store 914 includes a block 932 of instructions to direct the processor 908 to interface with the user through the control panel 906. This may include displaying prompts, obtaining timing information for checking amperage, and assignments of TEPS sensors 904 to be sampling or reference sensors, among others.

The data store 914 includes a block 934 of instructions to direct the processor 908 to measure the amperage generated by one of the TEPS sensors 904 using the sensor interface 916. The data store 914 includes a block 936 of instructions to direct the processor 908 to calculate amperage differentials between TEPS sensors 904, for example, determining differences between sampling sensors and reference sensors. This is termed a difference calculator herein. The amperage differentials may be time stamped and stored in an amperage data/time record 938.

The data store 914 also includes a block 940 of instructions to direct the processor 908 to determine if limits for amperage differentials between sensors have been exceeded. For example, if an amperage differential between a reference sensor and a sampling sensor exceeds a predetermined limit, such as about 5%, about 10%, or higher, the block 940 of instructions directs the processor to execute a block 942 of instructions to direct the processor to alert users to the potential corrosion. This may be performed through the control panel 906, the DCS 930, or both.

In some embodiments, trends in amperage differentials may be used to direct the processor to execute the block 942 of instructions. For example, if an amperage differential between a reference sensor and a sampling sensor has not exceeded the predetermined limit, but is increasing with each measurement, block 942 of instructions may be executed to alert users to the change.

EMBODIMENTS

An embodiment described herein provides a method for monitoring a mechanical device for internal corrosion. The method includes placing a sampling thermoelectric polymer sheet (TEPS) on an external surface of the mechanical device to be monitored for internal corrosion, and placing a reference TEPS on an external surface of the mechanical device not susceptible to internal corrosion. A current from the sampling TEPS is measured, and a current from the reference TEPS is measured. Potential internal corrosion is identified from changes between the current from the sampling TEPS and the current from the reference TEPS.

In an aspect, the method includes placing the sampling TEPS on an external surface of the mechanical device that previously showed internal corrosion. In an aspect, the method includes placing the reference TEPS on an external surface of the mechanical device that has not previously showed internal corrosion.

In an aspect, the method includes selecting a shape for the TEPS to cover a target location with a least amount of TEPS.

In an aspect, the method includes selecting a series of TEPS strips as the shape used to cover the target location. In an aspect, the method includes selecting a spiral shaped TEPS to cover the target location. In an aspect, the method includes selecting a dot shaped TEPS. In an aspect, the method includes selecting a shape for the TEPS to improve a probability of detection of the internal corrosion. In an aspect, the method includes selecting a shape for the TEPS to improve a determination of the location of the internal corrosion. In an aspect, the method includes selecting a plurality of shapes for different TEPSs to improve a probability of detection of the internal corrosion and a determination of the location of the corrosion.

In an aspect, the method includes measuring the current from the sampling TEPS by measuring a voltage drop across a resistor placed in parallel with the sampling TEPS. In an aspect, the method includes measuring the current from the reference TEPS by measuring a voltage drop across a resistor placed in parallel with the reference TEPS.

Another embodiment described herein, provides a system for monitoring a mechanical device for internal corrosion. The system includes a sampling thermoelectric polymer sheet (TEPS) disposed on an external surface of the mechanical device in a location that is susceptible to internal corrosion. A reference TEPS is disposed on an external surface of the mechanical device in a location that is not susceptible to internal corrosion. The system includes an ammeter to measure a current generated by the sampling TEPS and an ammeter to measure a current generated by the reference TEPS. The system includes a difference calculator to determine a difference between the current generated by the sampling TEPS and the current generated by the reference TEPS.

In an aspect, the system includes a thermoelectric polymer sheet includes a thermoelectric polymer that generates electricity when exposed to a temperature differential. In an aspect, the thermoelectric polymer includes poly(3-4-ethylenedixoythiophene) (PEDOT), polycarbazole, polythiophenes, polyanilines, or polyactylene, or any combinations thereof. In an aspect, the thermoelectric polymer includes a blend of poly(3-4-ethylenedixoythiophene) (PEDOT) and polystyrene sulfonate (PSS). In an aspect, the system includes a thermoelectric polymer sheet in the shape of a strip, a spiral, a star, or a dot, or any combinations thereof.

In an aspect, the ammeter to measure the current generated by the sampling TEPS includes a resistor in parallel with the sampling TEPS, and a voltmeter to measure a voltage drop across the resistor. In an aspect, the voltmeter includes an analog-to-digital converter.

In an aspect, the ammeter to measure the current generated by the reference TEPS includes a resistor in parallel with the reference TEPS, and a voltmeter to measure a voltage drop across the resistor. In an aspect, the voltmeter includes an analog-to-digital converter.

In an aspect, the system includes plurality of thermoelectric polymer sensors.

Other implementations are also within the scope of the following claims.

What is claimed is:

1. A method for monitoring a mechanical device for internal corrosion, comprising:
    placing a sampling thermoelectric polymer sheet (TEPS) on an external surface of the mechanical device to be monitored for internal corrosion;
    placing a reference TEPS on an external surface of the mechanical device not susceptible to internal corrosion;
    measuring a current from the sampling TEPS;
    measuring a current from the reference TEPS; and
    identifying potential internal corrosion from changes between the current from the sampling TEPS and the current from the reference TEPS.

2. The method of claim 1, comprising placing the sampling TEPS on an external surface of the mechanical device that previously showed internal corrosion.

3. The method of claim 1, comprising placing the reference TEPS on an external surface of the mechanical device that has not previously showed internal corrosion.

4. The method of claim 1, comprising measuring the current from the sampling TEPS by measuring a voltage drop across a resistor placed in parallel with the sampling TEPS.

5. The method of claim 1, comprising measuring the current from the reference TEPS by measuring a voltage drop across a resistor placed in parallel with the reference TEPS.

6. A system for monitoring a mechanical device for internal corrosion, comprising:
    a sampling thermoelectric polymer sheet (TEPS) disposed on an external surface of the mechanical device in a location that is susceptible to internal corrosion;
    a reference TEPS disposed on an external surface of the mechanical device in a location that is not susceptible to internal corrosion;
    an ammeter to measure a current generated by the sampling TEPS;
    an ammeter to measure a current generated by the reference TEPS; and
    a difference calculator to determine a difference between the current generated by the sampling TEPS and the current generated by the reference TEPS.

7. The system of claim 6, wherein a thermoelectric polymer sheet comprises a thermoelectric polymer that generates electricity when exposed to a temperature differential.

8. The system of claim 7, wherein the thermoelectric polymer comprises poly(3-4-ethylenedixoythiophene) (PEDOT), polycarbazole, polythiophenes, polyanilines, or polyactylene, or any combinations thereof.

9. The system of claim 7, wherein the thermoelectric polymer comprises a blend of poly(3-4-ethylenedixoythiophene) (PEDOT) and polystyrene sulfonate (PSS).

10. The system of claim 6, wherein a thermoelectric polymer sheet is in the shape of a strip, a spiral, a star, or a dot, or any combinations thereof.

11. The system of claim 6, wherein the ammeter to measure the current generated by the sampling TEPS comprises:
    a resistor in parallel with the sampling TEPS; and
    a voltmeter to measure a voltage drop across the resistor.

12. The system of claim 11, wherein the voltmeter comprises an analog to digital converter.

13. The system of claim 6, wherein the ammeter to measure the current generated by the reference TEPS comprises:
    a resistor in parallel with the reference TEPS; and
    a voltmeter to measure a voltage drop across the resistor.

14. The system of claim 13, wherein the voltmeter comprises an analog-to-digital converter.

* * * * *